Feb. 10, 1970 R. H. CORNELY ET AL 3,495,140

LIGHT-EMITTING DIODES AND METHOD OF MAKING SAME

Filed Oct. 12, 1967 2 Sheets-Sheet 1

INVENTORS
ROY H. CORNELY AND
WALTER F. KOSONOCKY

BY Arthur I. Spechler
ATTORNEY

INVENTORS
ROY H. CORNELY AND
WALTER F. KOSONOCKY

BY Arthur J. Spechler
ATTORNEY

United States Patent Office 3,495,140

Patented Feb. 10, 1970

3,495,140

LIGHT-EMITTING DIODES AND METHOD OF MAKING SAME

Roy H. Cornely and Walter F. Kosonocky, Skillman, N.J., assignors to RCA Corporation, a corporation of Delaware Filed Oct. 12, 1967, Ser. No. 674,886
Int. Cl. H01l 7/00, 9/00, 9/10
U.S. Cl. 317—235 11 Claims

ABSTRACT OF THE DISCLOSURE

A light-emitting diode comprises a PN junction whose effective width is defined by the thickness of a portion of semiconductor material of one type conductivity epitaxially grown in the cleavage crack of a cleaved wafer of semiconductor material of relatively high resistivity. Layers of semiconductor material of mutually opposite type conductivities are deposited adjacent opposite major surfaces, respectively, of the cleaved wafer, one of the layers being integral with, and substantially similar to, the aforementioned portion.

The improved method of making the diode comprises:

(a) cleaving a wafer of semiconductor material, (b) maintaining the parts of the cleaved wafer closely spaced from each other, and (c) depositing a pair of layers of highly doped semiconductor material of opposite type conductivities adjacent opposite major surfaces, respectively, of the cleaved wafer, a portion of semiconductor material similar to one of the layers being integral therewith and extending into the space between the parts of the cleaved wafer and forming a PN junction with the other layer.

Each of the parts of the cleaved wafer may comprise a plurality of layers of semiconductor material of opposite type conductivities and also have at least one PN junction that is back-biased by means causing current to flow through the diode in a forward direction.

Background of the invention

This invention relates generally to semiconductor diodes, and more particularly to improved light-emitting semiconductor diodes and an improved method of making them. The improved method is particularly useful for providing improved light-emitting diodes and laser diodes of the GaAs type employed in light communication systems.

In order to provide a light-emitting diode or an injection-type laser diode of the semiconductor type that will operate efficiently at room temperature with a relatively low voltage power supply, it is desirable for the diode to possess the characteristics of a low threshold current and good heat dissipation. The low threshold current characteristic is satisfied by making the PN junction area of the diode as small as possible. Good heat dissipation is accomplished by providing the diode with suitable heat sink means. While several methods have been proposed to make a light-emitting diode with the aforementioned characteristics, some of these methods are commercially impractical because they are either too complex, too expensive, or require elaborate control and monitoring operations.

Summary of the invention

Briefly stated, one embodiment of the improved diode comprises two parts of a wafer having surfaces that are disposed in mutually facing relationship and defining a narrow space that extends transversely to the opposite major surfaces of the wafer. In a preferred embodiment, the mutually facing surfaces are those formed by a cleavage of the wafer P type and N type layers are deposited adjacent the opposite major surfaces, respectively, of the wafer. A portion of semiconductor material similar to, and integral with, one of the layers extends into the space between the parts of the wafer and forms a PN junction with the other of the layers.

In another embodiment of the improved diode, each of the parts of the wafer comprises a plurality of layers of semiconductor material of mutually opposite type conductivities, having at least one PN junction substantially parallel to the opposite major surfaces of the wafer.

The improved diode is made by an improved method which comprises the steps of (a) providing two parts, preferably cleaved, of a wafer of semiconductor material, (b) maintaining the parts of the wafer in a closely spaced relationship, substantially as originally occurring in the wafer, (c) depositing a first layer of one type conductivity on one major surface of the wafer with a portion of the first layer extending into the space between the parts of the wafer, and (d) depositing a second layer of an opposite type conductivity adjacent the other major surface of the wafer so that the second layer forms a PN junction with the portion of the first layer in the space between the parts.

A diode made by the improved method can have a PN junction whose effective width is in the range between a fraction of a micron and a few microns so that the threshold current to produce lasing can be as low as possible. The portion of the wafer remaining as part of the final diode structure permits the use of relatively large, highly doped P type and N type layers for the diode, providing the diode with extra strength and with very good heat sink means. Also, since the wafer and the P type and N type layers of the improved diode have substantially the same coefficient of expansion, no undue thermal stresses are set up within the diode under operating conditions.

Description of the preferred embodiments

Figure 1:
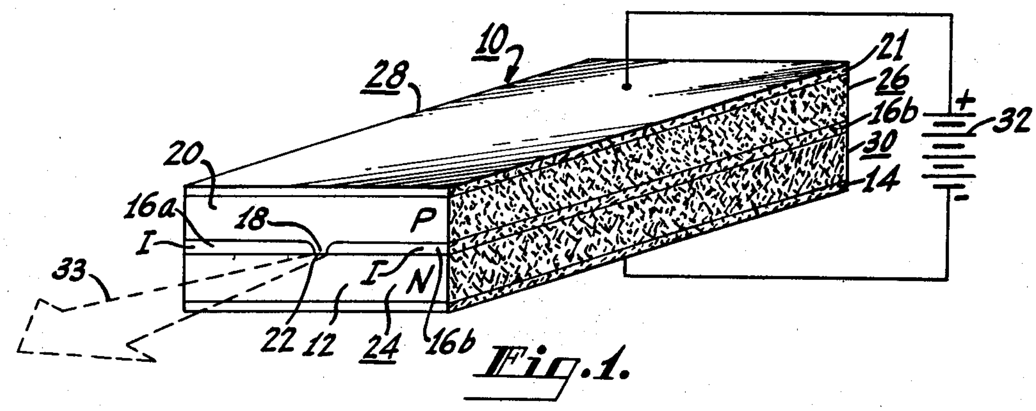
FIG. 1 is an enlarged perspective view of an improved light-emitting diode made by the improved method, showing the diode connected in a schematic circuit for operation.

Referring now particularly to FIG. 1 of the drawing, there is shown one embodiment of an improved light-emitting diode 10 made by the improved method to possess the characteristics of a relatively very low threshold current for lasing and very low heat losses. A typical improved diode 10 comprises a parallelpiped structure having a width of about 5 mils, a length of about 10 mils, and a height of about 4 mils.

The diode 10 comprises a relatively highly doped layer 12 of N type semiconductor material, such as GaAs (gallium arsenide), for example, having a carrier concentration in excess of $10^{18}$/cm.$^3$. The lower major surface of the layer 12, looking at FIG. 1, is metalized, as by the vacuum depoistion of tin and by the successive electroless platings of nickel and gold, to provide an electrical contact layer 14. The other major surface of the layer 12 is crystallographically integral with two very closely spaced parts **16*a* and 16*b* of a monocrystalline semiconductor material of a relatively high resistivity, preferably intrinsic GaAs. The resistivity of the semiconductor parts 16*a* and 16*b*** should be less than $10^{16}$ carriers/cm.$^3$.

Figure 2:
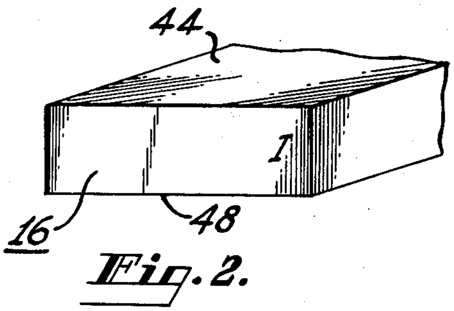
FIGS. 2 and 3 are fragmentary perspective views of wafers used in the improved method of making the diode.

The parts **16*a* and 16*b* are preferably those cleaved from an original wafer 16, shown in FIG. 2. The parts 16*a* and 16*b* in the diode 10 are separated by a small portion 18 of a relatively highly doped layer 20 of P type conductivity GaAs, having a carrier concentration in excess of $10^{19}$ carriers/cm.$^3$. The layer 20 and its portion 18 are crystallographically integral with the parts 16*a* and 16*b*. The portion 18 of the layer 20 also forms a PN junction 22 with the layer 12. The PN junction 22 may be between a fraction of a micron and about 5 microns in width and about 10 mils in length. The upper major surface of the layer 20, looking at FIG. 1, is metalized, as by successive electroless depositions of nickel and gold, to provide an electrical contact layer 21**.

The front and rear surfaces 24 and 26, respectively, of the diode 10 are polished (cleaved), parallel planar surfaces that are partially light-reflecting and partially light-transmitting. The opposite side surfaces 28 and 30 of the diode may be formed by any suitable method, as by cleaving or sawing, for example.

In operation, a source 32 of suitable voltage is applied across the contact layers 14 and 22 of the diode 10 to bias the PN junction 22 in a forward direction, whereby current can flow easily through the PN junction 22. Since the parts **16*a* and 16*b* of the wafer 16 are of relatively higher resistivity than the highly doped N type and P type layers 12 and 20, respectively, substantially all of the current through the diode 20 flows through the portion 18 of the layer 20 and the PN junction 22. Also, since the width of the PN junction 22 is relatively small, in the order of microns or a fraction thereof, and since the overall bulk of the diode is relatively large compared to the PN junction 22, the diode 10** possesses the characteristics of a relatively low lasing threshold current and good heat dissipation.

The diode 10 of GaAs may lase (produce a coherent light output) with a threshold current of about 100 ma. at room temperature and with a threshold current of about 10 ma. at 77° K. The light emitted, represented by the dashed arrow 33, during such laser operation is in the infrared range. Current through the diode 10 that is below a threshold value causes the diode to emit incoherent light.

The method of making the diode 10 comprises the steps of epitaxially growing the N type and P type layers 12 and 20 to the opposite, cleaned and polished, parallel major surfaces, respectively, of the cleaved wafer 16, shown in FIG. 2. These operations are carried out in a graphite boat 34 (FIG. 4) disposed within a furnace tube 36. The furnace tube 36 is heated electrically by a coil 37, in a manner well known in the art. The wafer 16 is held firmly against the floor of the boat 34 by a wedge or holding member 38 and a relatively resilient shim 40, both of which may also be of carbon. The shim 40 (FIG. 5) is formed with a slot 42 at the site where the wafer 16 is to be cleaved. The slotted shim 40 functions as a resilient member to hold the parts **16*a* and 16*b* firmly together after the wafer 16** is cleaved.

The wafer 16 is preferably a cleavable semiconductor material, such as GaAs or $GaIn_xAs_{1-x}$, for example, having opposite major surfaces in the 100 crystal plane. Pressure applied to one major surface of the wafer 16, as with a wooden member, will cleave the wafer 16 at substantially right angles (in the 110 crystal plane) to the opposite major surfaces. Originally, the wafer 16 may be about 7 mils thick and any desired convenient width or length.

Figure 5:
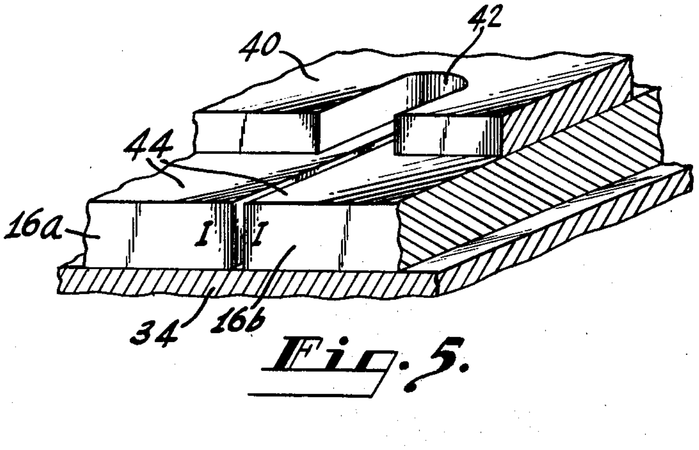
FIG. 5 is a fragmentary perspective view of the wafer illustrated in FIG. 2 as it is held in a cleaved position in the apparatus shown in FIG. 4.

Referring now to FIG. 5, the wafer 16 is shown divided (cleaved) into its parts **16*a* and 16*b* and held firmly against the floor of the boat 34 by the slotted shim 40. The parts 16*a* and 16*b* should be held in closely spaced-apart relationship in substantially the same orientation they occupied in the original wafer 16, that is, before the wafer 16 was cleaved. The illustration of the separation of the parts 16*a* and 16*b* in the drawing is exaggerated for the sake of clarity. In practicing the improved method, however, the cleaved parts 16*a* and 16*b* should be separated by a space having a width in the range between a fraction of a micron and about 5 microns if a very narrow PN junction 22 is desired, giving the diode 10** the lowest threshold current characteristic for lasing.

Figure 4:
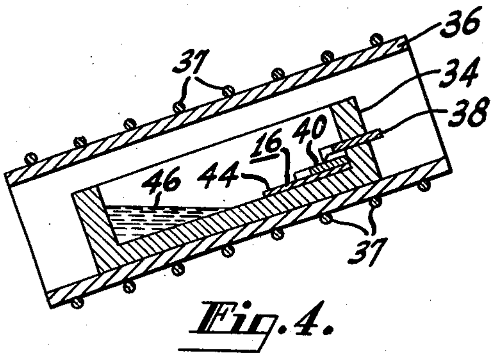
FIG. 4 is a longitudinal cross-sectional view of apparatus used in the improved method of making the diode.

The highly doped P type layer 20 is epitaxially deposited on the cleaned upper major surface 44 (FIG. 2) of the wafer 16 by an operation of crystalline regrowth from a solution. To this end, a mixture of components in the proportions of 8 grams gallium, 1.8 grams gallium arsenide, and about 0.5 gram zinc is heated to form a molten solution 46 (FIG. 4). The heating is done within the boat 34 in the heated furnace tube 36. During this heating, the boat 34 is tilted so that the solution 46 is out of contact with the wafer 16 (of GaAs). When the solution 46 reaches a temperature of between 910° C. and 950° C., the furnace tube 36 is tilted (clockwise looking at FIG. 4) so that the solution 46 covers the major surface 44 of the wafer 16. Heat is now removed from the furnace tube 36, as by deenergizing the coil 37, and the solution 46 is allowed to cool to about 400° C. At about 400° C. the furnace tube 36 is tilted again, to its original position, as shown in FIG. 4.

Figure 6:
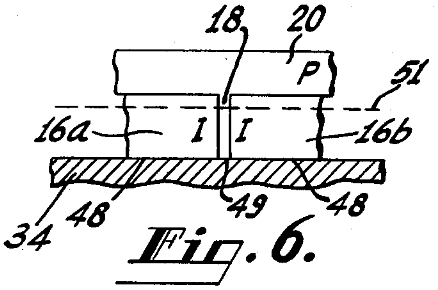
FIGS. 6 and 7 are fragmentary front elevational views of the cleaved wafer during operations of growing layers thereon by the improved method.

During the cooling period of the solution 46 (from 950° C. to 400° C.), the highly (Zn) doped monocrystalline layer 20 is crystallographically deposited on the wafer 16 to a thickness of about 4 mils, as shown in FIG. 6. A portion 18 (FIG. 6) of the layer 20 is also epitaxially deposited between the cleaved surfaces of the parts **16*a* and 16*b* of the wafer 16. During this deposition, a small amount of material from the cleaved surfaces of the parts 16*a* and 16*b* is dissolved so that the width of the epitaxially grown portion 18** is slightly greater than any spacing (crack) that may have existed originally between the cleaved parts.

The operation of epitaxially growing the P type layer 20 on the wafer 16 is generally known as the solution regrowth method, described in an article, "Epitaxial Growth of GaAs and Ge from the Liquid State and Its Application to the Fabrication of Tunnel and Laser Diodes," by H. Nelson, RCA Review, vol. 24, pp. 603–615, December 1965.

The lower surface 48 (FIG. 6) of the parts **16*a* and 16*b*, as well as the lower surface 49 (FIG. 6) of the portion 18 of the layer 20 are lapped simultaneously (to a surface indicated by the dashed line 51) to provide a cleaned planar surface and a thickness of the parts 16*a* and 16*b*** of between 2 and 12 microns.

Figure 7:
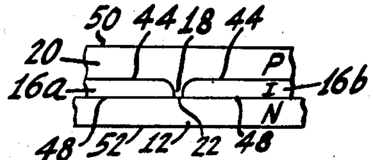

The N type layer 12 of highly doped gallium arsenide is now deposited adjacent the lapped and cleaned planar surface including the surface 48 and the surface 49 of the portion 18 of the layer 20. To this end, a mixture of components in the portions of 8 grams gallium, 1.2 grams gallium arsenide, and 4 milligrams tellurium is heated in the boat 34 to a temperature of between 880° C. and 920° C. while the furnace tube 36 is tilted, as shown in FIG. 4, and out of contact with the wafer 16. When the heated solution reaches a temperature between 880° C. and 920° C., the mixture melts and the tube 36 is tilted (clockwise looking at FIG. 4) so that the solution is disposed over the lapped surfaces 48 of the wafer 16 and the lapped surface 49 of the portion 18 of the layer 20. The solution is now allowed to cool to a temperature of about 400° C. by removing the current to the heating coil 37. A thermocouple thermometer (not shown) may be used to monitor the temperature of the solution. During the cooling period (920° C. to 400° C.), gallium arsenide is initially dissolved from the surface 48 of the wafer 16 and the surface 49 of the portion 18 by the heated solution and then crystallized from the solution to form the highly doped (Te), epitaxially grown N type layer 12, as shown in FIG. 7.

After the solution has cooled to the temperature of about 400° C., the furnace tube 36 is tilted (counterclockwise) to its original position, as shown in FIG. 4, removing the bulk of the solution from the cleaved wafer 16 and leaving thereon the epitaxially deposited N type layer 12 of monocrystalline gallium arsenide, highly doped with tellurium.

The N type layer 12 may also be deposited epitaxially from the vapor phase by any method known in the art.

The exposed opposite major surfaces 50 and 52 (FIG. 7) of the layers 20 and 12, respectively, are now lapped until the layers 20 and 12 are each about 2 mils in thickness and the lapped surfaces 50 and 52 metalized, as previously described, to provide the electrical contact layers 22 and 14, respectively, as shown in FIG. 1.

The improved diode 10 is formed from the sandwich type structure, shown in FIG. 7, by appropriately cleaving the easily cleavable sandwich structure of GaAs to provide the cleaved partially light-reflecting and partially light-transmitting front and rear surfaces 24 and 26. The opposite side surfaces 28 and 30 may be formed by any sawing or cleaving operations well known in the art.

Figure 3:
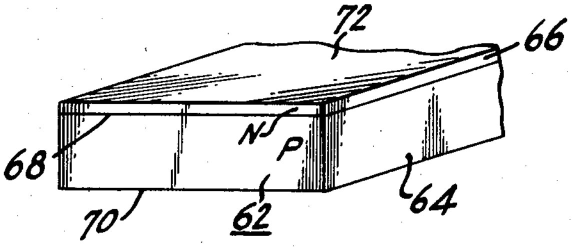
Figure 8:
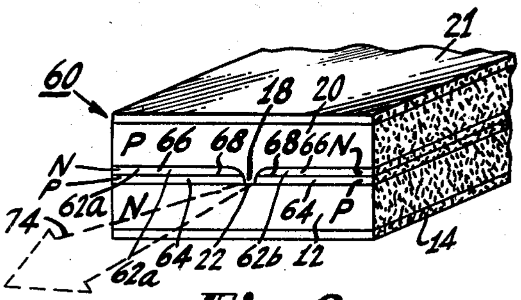
FIG. 8 is a fragmentary enlarged perspective view of another embodiment of the diode made by the improved method, using the wafer shown in FIG. 3.

Referring now to FIG. 8 of the drawings, there is shown another embodiment of an improved diode 60 made by the improved method. The diode 60 is similar to the diode 10 except for the cleaved parts **62*a* and 62*b* which are formed from a wafer 62 of semiconductor material, shown in FIG. 3. The wafer 62 is originally about 7 mils in thickness and comprises at least two layers of mutually opposite type conductivities. For example, the wafer 62 comprises a relatively thick layer 64 of GaAs of P type conductivity and a relatively thinner layer 66 of GaAs of N type conductivity epitaxially grown on the layer 64 and forming a PN junction 68 therewith. The layer 66** is preferably in the order of about one micron in thickness.

In making the diode 50 by the improved method, the wafer 62 is cleaved into parts **62*a* and 62*b*, and the N type and P type layers 12 and 20 are epitaxially grown on the opposite lapped, cleaned, and etched major surfaces 70 and 72, respectively, of the original wafer 62, substantially as described for the treatment of the wafer 16 in making the diode 10. The thickness of the parts 62*a* and 62*b* in the finished diode 60 are between 2 and 12 microns, and each part has a portion of the PN junction 68** therein.

When the diode 60 is connected in an electrical circuit, as described for the diode 10 in FIG. 1, that is, when the positive terminal of the voltage source 32 is applied to the contact layer 22 (FIG. 8) and the negative terminal of the voltage source 32 is applied to a contact layer 14, conventional current flows easily from the layer 20 to the layer 12 through the PN junction 22. At the same time, the PN junction 68, between the layers 64 and 66 in each of the parts **62*a* and 62*b*, is back-biased by the voltage source 32 providing the current flow. Consequently, substantially all of the current flowing in a forward direction through the diode 60 is through the portion 18 of the layer 20 and across the PN junction 22 formed by the portion 18 and the layer 12. At or above a threshold current at a particular temperature, the diode 60 lases and infrared light is emitted substantially in the plane of the PN junction 22, as shown by the dashed arrow 74**.

In the diode 60, the cleaved wafer 62 need not be of as high resistivity as is necessary for the cleaved wafer 16 because the PN junction 68 in each of the parts **62*a* and 62*b* is back-biased when current flows through the PN junction 22 in a forward direction. Hence, substantially no current flows across the PN junctions 68. Also, the PN junctions 68 provide a better back-bias when the layers 64 and 66 of the wafer 62 are of a relatively lower resistivity, that is, of relatively higher conductivity, say substantially the same as that for the layers 20 and 12**, respectively.

Although the P-type layer 20 of the diode 60 is integral with the P type layer 64, substantially all of the current through the diode 60 flows in a forward direction through the very narrow PN junction 22, whose width is defined substantially by the thickness of the portion 18 of the layer 20 between the cleaved parts **62*a* and 62*b*. This results because the junctions 68 are back-biased and the thickness of the layer 64** is in the order of 1 micron, offering very high resistance to the flow of current along its length and very low resistance across its width (thickness).

Figure 10:
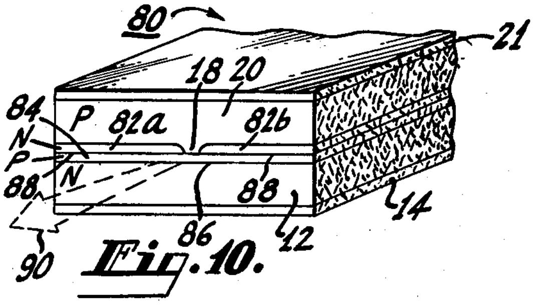
FIG. 10 is a fragmentary enlarged perspective view of another embodiment of the diode made by the improved method, using the cleaved wafer and layers shown in FIG. 9.

Substantially the same characteristics provided by the light-emitting diode 60 can be provided by another embodiment of an improved light-emitting diode 80, shown in FIG. 10. Similar reference characters in the diodes 10, 60 and 80 refer to similar parts. Referring now particularly to FIG. 10, the diode 80 comprises the P type layer 20 deposited on the upper major surface of a cleaved wafer 82, providing parts **82*a* and 82*b*. A portion 18 of the layer 20 extends into the space between the coplanar aligned parts 82*a* and 82*b*. The parts 82*a* and 82*b*** are are of N type conductivity and of relatively low resistivity, having a carrier concentration of about $10^{18}$ carriers/cm.$^3$.

A very thin layer 84 of P type conductivity, having a thickness in the order of about one micron and of relatively low resistivity provided by a carrier concentration of about $10^{19}$ carriers/cm$^3$, is disposed between the N type layer 12 and the lower major surface of the cleaved wafer 82. The layer 84 is crystallographically integral with the portion 18 of the layer 20 and forms one PN junction 86 with the layer 12 and a pair of separate PN junctions 88 with each of the lower major surfaces of the parts **82*a* and 82*b***.

Figure 9:
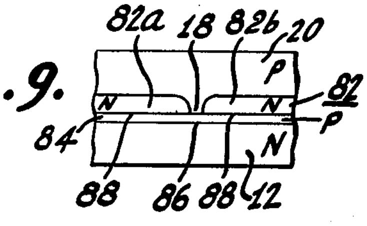
FIG. 9 is a fragmentary front elevational view of another cleaved wafer during operations of growing P type and N type layers thereon by the improved method.

The improved diode 80 is made by an embodiment of the improved method wherein the P type layer 20 is epitaxially grown on the coplanar aligned parts **82*a* and 82*b* of the cleaved wafer 82, illustrated in FIG. 9, substantially as described above for the method of making the diode 10. The portion 18 of the layer 20 fills the space (crack) between the parts 82*a* and 82*b*. The lower major surfaces of the parts 82*a* and 82*b*, including the lower surface of the portion 18, looking at FIG. 9, are lapped, cleaned, and etched to provide a cleaned planar surface and a desired thickness (between 2 and 12 microns) of the parts 82*a* and 82*b*. The layer 84 of P type conductivity is epitaxially deposited on the cleaned surface. This deposition may be either by the solution regrowth method, described above, or by the vapor phase method known in the art. The thickness of the layer 84 is in the order of about one micron. Next, the N type layer 12 is epitaxially deposited on the P type layer 84, also either by the solution regrowth method or the vapor phase method to a thickness of about two mils. The resulting sandwich structure, shown in FIG. 9, is shaped into the parallelepiped-shaped diode 80, shown in FIG. 10, substantially as described for the diode 10**.

When the diode 80 is connected in the electrical circuit illustrated for the diode 10 in FIG. 1, that is, when the positive terminal of the voltage source 32 is applied to the contact layer 22 (FIG. 10) and the negative terminal of the voltage source 32 is applied to the contact layer 14, conventional current flows easily from the P type layer 20, through the portion 18 of the layer 20, through the PN junction 86, and to the N type layer 12. In flowing across the PN junction 86, substantially all of the current flows through only a very narrow area of the PN junction 88, the width of the effective PN junction 88 being defined substantially by the spacing between the parts 82*a* and 82*b*. This action results from substantially the same reasons advanced for the current flowing through the very narrow PN junction 22 of the diode 60 (FIG. 8). When the current through the diode 80 is at or above a threshold value for a given temperature, light (infrared, if the semiconductor material is GaAs) is emitted substantially in the plane of the PN junction 86 in the direction shown by the dashed arrow 90.

While the improved light-emitting diodes described herein have been designated as having layers and parts with specific type conductivities, it is within the contemplation of the present invention to reverse these type conductivities to opposite type conductivities in each of the diodes.

What is claimed is:

1. A diode comprising:

two parts of a wafer of semiconductor material disposed in coplanar alignment, said parts being completely separated by a relatively narrow space extending transversely to, and between, the opposite major surfaces of said wafer, a pair of layers of semiconductor material of mutually opposite type conductivities disposed adjacent said opposite major surfaces, respectively, of said wafer, and a portion of semiconductor material substantially similar to that of one of said layers being integral therewith and extending through said space and forming a PN junction with the other of said layers.

2. A diode as defined in claim 1 wherein said semiconductor material comprises GaAs and said wafer has a relatively higher resistivity than that of either of said layers.

3. A diode as defined in claim 1 wherein said semiconductor material comprises one chosen from the group consisting of GaAs and $GaIn_xAs_{1-x}$.

4. A diode as defined in claim 1 wherein said semiconductor material comprises GaAs, said wafer has a carrier concentration of less than $10^{16}$ carriers/cm.$^3$, said one layer is P type and has a carrier concentration in excess of $10^{19}$ carriers/cm.$^3$, and said other layer is N type and has a carrier concentration in excess of $10^{18}$ carriers/cm.$^3$.

5. A diode as defined in claim 1 wherein said semiconductor material comprises GaAs, each of said parts of said wafer has a thickness of between 2 and 12 microns, the width of said portion in said space is between a fraction of a micron and about 5 microns, and each of said layers has a thickness of about 2 mils.

6. A diode as defined in claim 1 wherein each of said parts is a cleaved part of said wafer and comprises a plurality of layers of semiconductor material of opposite type conductivities and has at least one PN junction therein that is back-biased by means causing current to flow through said diode in a forward direction.

7. A diode as defined in claim 1 wherein a relatively much thinner layer than each of said pair of layers and of the same type conductivity as said one layer is crystallographically integral with said portion and disposed between said other of said layers and said wafer, said thinner layer having a thickness of about 1 micron.

8. A diode comprising:

a first layer of semiconductor material of one type conductivity, two wafers of semiconductor material adjacent one major surface of said first layer, said wafers being separated by a relatively narrow space, a second layer of semiconductor material of an opposite type conductivity to said one type conductivity on said two wafers, and a portion of semiconductor material similar to, and integral with, said second layer extending into said space and forming a PN junction with said first layer, said PN junction having a relatively much lower resistance to current flow in a forward direction therethrough than each of said wafers when a voltage is applied across said diode to provide said current flow.

9. A diode as defined in claim 8, wherein each of said wafers comprises a plurality of layers of semiconductor material of opposite type conductivities and has at least one PN junction that is back-biased by means causing current to flow in a forward direction through said diode, wherein substantially all current flowing through said diode in a forward direction flows through said PN junction formed between said first and second layers.

10. A diode as defined in claim 8, wherein said wafers have a carrier concentration of less than $10^{16}$ carriers/cm.$^3$, said first and second layers are relatively highly doped, said PN junction has a width of between a fraction of a micron and about 5 microns, and the thickness of each of said parts is between 2 and about 12 microns.

11. A light-emitting semiconductor device comprising:

a pair of parts of a semiconductor wafer disposed mutually coplanar with their adjacent sides spaced closely apart to form a gap therebetween, a first body of semiconductor material disposed on one coplanar pair of major faces of said parts, said body covering the portion of said parts adjacent said gap and extending into and filling said gap and having a distal surface coplanar with the opposite coplanar major faces of said parts, and a second semiconductor body disposed on said opposite coplanar major faces of said parts and covering said distal surface and portions of said coplanar part major faces adjacent said distal surface to form a PN junction with that portion of said first body in said gap.

References Cited

UNITED STATES PATENTS

| | | | |
|---|---|---|---|
| 3,312,881 | 4/1967 | Yu | 317—235 |
| 3,247,576 | 4/1966 | Dill | 29—155.5 |
| 3,410,735 | 11/1968 | Hackley | 148—180 |
| 3,327,182 | 6/1967 | Kisinko | 317—235 |

OTHER REFERENCES

C. Le May: Manufacture of Semiconductor Devices, I.B.M. Technical Disclosure Bulletin, vol. 5, No. 2, July 1962.

JOHN W. HUCKERT, Primary Examiner

MARTIN H. EDLOW, Assistant Examiner

U.S. Cl. X.R.

17—234; 313—108; 331—94.5